US012565712B2

(12) United States Patent
Morrow

(10) Patent No.: US 12,565,712 B2
(45) Date of Patent: Mar. 3, 2026

(54) METHOD OF MANUFACTURE OF A WATCH CRYSTAL

(71) Applicant: Corey Albert Morrow, Oshawa (CA)

(72) Inventor: Corey Albert Morrow, Oshawa (CA)

( * ) Notice: Subject to any disclaimer, the term of this patent is extended or adjusted under 35 U.S.C. 154(b) by 315 days.

(21) Appl. No.: 18/322,662

(22) Filed: May 24, 2023

(65) Prior Publication Data

US 2024/0392473 A1 Nov. 28, 2024

(51) Int. Cl.
*C30B 25/16* (2006.01)
*A44C 27/00* (2006.01)
*C30B 29/04* (2006.01)
*C30B 30/00* (2006.01)
*C30B 33/00* (2006.01)

(52) U.S. Cl.
CPC ............ *C30B 29/04* (2013.01); *A44C 27/001* (2013.01); *C30B 25/16* (2013.01); *C30B 30/00* (2013.01); *C30B 33/00* (2013.01)

(58) Field of Classification Search
CPC ......... C30B 29/04; C30B 25/16; C30B 30/00; C30B 33/00; A44C 27/001
See application file for complete search history.

(56) References Cited

U.S. PATENT DOCUMENTS 8,460,464 B2 * 6/2013 Bhandari .............. C30B 25/105
117/88
2004/0154528 A1 * 8/2004 Page, Jr. ................. C30B 23/00
117/84
2006/0144322 A9 * 7/2006 Hemley ................ C23C 16/279
2015/0315787 A1 * 11/2015 Swenters .................. E04C 3/32
52/633
2016/0066662 A1 * 3/2016 Rosenberg ............. A44C 17/02
428/626
2016/0161991 A1 * 6/2016 Ciraldo ................ G04B 39/006
428/408
2017/0009376 A1 * 1/2017 Khan .................... C30B 25/105
2020/0199780 A1 * 6/2020 Quack ................... G04B 13/02
2021/0235823 A1 * 8/2021 Damri ................... C23C 16/279

* cited by examiner

*Primary Examiner* — Robert M Kunemund
(74) *Attorney, Agent, or Firm* — Orin Del Vecchio

(57) ABSTRACT

A method of manufacturing a diamond watch crystal wherein the present invention employs multiple techniques to produce the final product. The method of the present invention initiates with a chemical vapor deposition process wherein a high purity graphite is employed as the source substrate. This step further deploys utilization of gases, temperature and an energy source to facilitate formation of a diamond layer on the substrate. The present invention provides alternate energy sources during the chemical vapor deposition such as but not limited to, microwave plasma, direct current plasma, inductively-coupled plasma and hot filament techniques. The method of the present invention further deploys a high pressure high temperature step subsequent the chemical vapor deposition step. These two steps are repeated wherein the initial latter step includes a diamond seed. A final high pressure high temperature step is utilized to remove impurities prior to cutting and polishing.

13 Claims, 1 Drawing Sheet

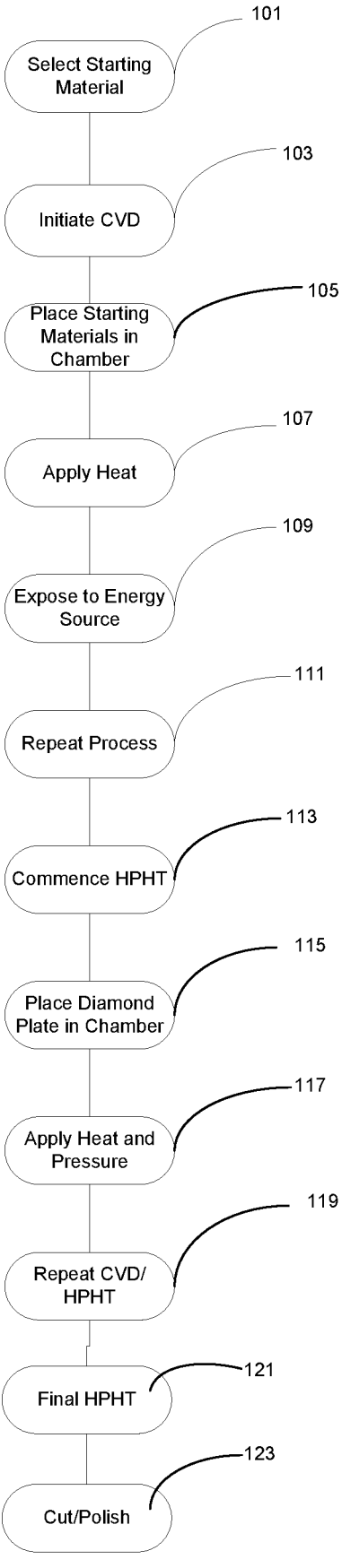

METHOD OF MANUFACTURE OF A WATCH CRYSTAL

FIELD OF THE INVENTION

The present invention relates generally to diamond manufacturing, more specifically but not by way of limitation, a method of manufacturing a watch crystal wherein the method deploys a plurality of techniques to provide manufacture of a watch crystal.

BACKGROUND

Formation of lab grown diamonds can be executed utilizing two processes known as Chemical Vapor Deposition (CVD) and high pressure high temperature(HPHT). The chemical vapor deposition process is initiated with a small seed diamond, wherein the seed diamond a small natural diamond fragment that can undergo both extreme temperature and pressure conditions. While many diamond fragments can be employed as the seed diamond it is common for the process to be initiated with a strong high grade diamond fragment as this can be crucial in the lab diamond creation process. During the CVD process, the seed diamond is placed in a vacuum chamber and the chamber is subsequently filled with gases that are heavy in carbon. Ensuing flooding the vacuum chamber with carbon-ladened gases the chamber is then heated to over 1,000 degrees Fahrenheit. The extreme heat then turns the gases into a plasma. The plasma builds the layers of the diamonds, creating at the end of the process a full diamond that can then be processed similarly as to a rough mined diamond.

Employing the CVD process often results in diamonds that more often are even better quality than any crafted from naturally mined diamonds. The other method for creating man made diamonds is called high pressure high temperature. During this process, a pure source of carbon is placed under high pressure and high temperature. The extreme heat and intense pressure result in the crystallization of the carbon, which results in the formation of a brand-new diamond. As is known in the art, watch crystals, also known as faces, for luxury brands are often manufactured from sapphire. Sapphire can be a desirable material for watch crystals as the material is durable and offers pleasing aesthetics from a cosmetic perspective for luxury watches. While sapphire is durable, diamonds are far more scratch resistant and can additionally endure greater pressure.

Accordingly, there is a need for a method of manufacturing a watch crystal that employs a combination of diamond manufacturing techniques so as to facilitate successful production of a diamond watch crystal.

SUMMARY OF THE INVENTION

It is the object of the present invention to provide a method of manufacturing a watch crystal from a diamond growing process wherein the method of the present invention employs utilization of the chemical vapor deposition process in an initial step.

Another object of the present invention is to provide a method for growing diamonds to be utilized as a watch crystal wherein the second step of the present invention subjects a diamond plate created in the initial step to a high pressure high temperature environment.

A further object of the present invention is to provide a method of manufacturing a watch crystal from a diamond growing process wherein an additional step of the present invention includes repeating of the first two steps of the method of the present invention.

Yet a further object of the present invention is to provide a method for growing diamonds to be utilized as a watch crystal wherein a further step of the method of the present invention employs microwave plasma assisted chemical vapor deposition.

Still another object of the present invention is to provide a method of manufacturing a watch crystal from a diamond growing process that can alternatively employ a step incorporating hot filament chemical vapor deposition.

An additional object of the present invention is to provide a method for growing diamonds to be utilized as a watch crystal wherein the method of the present invention can further utilize a step of employing inductively coupled plasma-enhance chemical vapor deposition.

Yet a further object of the present invention is to provide a method of manufacturing a watch crystal from a diamond growing process wherein the method of the present invention further includes an alternate step of utilizing direct current plasma-enhanced chemical vapor deposition.

To the accomplishment of the above and related objects the present invention may be embodied in the form illustrated in the accompanying drawings. Attention is called to the fact that the drawings are illustrative only. Variations are contemplated as being a part of the present invention, limited only by the scope of the claims.

BRIEF DESCRIPTION OF THE DRAWINGS

A more complete understanding of the present invention may be had by reference to the following Detailed Description and appended claims when taken in conjunction with the accompanying Drawings wherein:

FIG. 1 is a flowchart diagram of the method of the present invention.

DETAILED DESCRIPTION

Referring now to the drawings submitted herewith, wherein various elements depicted therein are not necessarily drawn to scale and wherein through the views and FIGURES like elements are referenced with identical reference numerals, there is illustrated a method for manufacturing a watch crystal 100 constructed according to the principles of the present invention.

An embodiment of the present invention is discussed herein with reference to the FIGURES submitted herewith. Those skilled in the art will understand that the detailed description herein with respect to these FIGURES is for explanatory purposes and that it is contemplated within the scope of the present invention that alternative embodiments are plausible. By way of example but not by way of limitation, those having skill in the art in light of the present teachings of the present invention will recognize a plurality of alternate and suitable approaches dependent upon the needs of the particular application to implement the functionality of any given detail described herein, beyond that of the particular implementation choices in the embodiment described herein. Various modifications and embodiments are within the scope of the present invention.

It is to be further understood that the present invention is not limited to the particular methodology, materials, uses and applications described herein, as these may vary. Furthermore, it is also to be understood that the terminology used herein is used for the purpose of describing particular embodiments only, and is not intended to limit the scope of the present invention. It must be noted that as used herein and in the claims, the singular forms "a", "an" and "the" include the plural reference unless the context clearly dictates otherwise. Thus, for example, a reference to "an element" is a reference to one or more elements and includes equivalents thereof known to those skilled in the art. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

References to "one embodiment", "an embodiment", "exemplary embodiments", and the like may indicate that the embodiment(s) of the invention so described may include a particular feature, structure or characteristic, but not every embodiment necessarily includes the particular feature, structure or characteristic.

Referring in particular to the FIGURES submitted herewith, the method for manufacturing a watch crystal 100 is illustrated on the flowchart of FIG. 1. It should be understood within the scope of the present invention that the resulting diamond crystal from the process of the present invention could be produced in alternate sizes, shapes and thicknesses. In step 101, the selection of the starting materials is performed. It should be understood within the scope of the present invention that the ultra-high purity gases are employed as well as high purity graphite for the carbon source. The gases employed in a preferred embodiment of the present invention are hydrogen, and methane. It should be understood within the scope of the present invention that alternate gases could be employed in the present invention and achieve the desired outcome. Furthermore, it is contemplated within the scope of the present invention that alternate materials in addition to or in combination with graphite for the carbon source. Step 103, the chemical vapor deposition process is initiated. The chemical vapor deposition process is employed to grow a thin diamond plate having a preferred thickness of two to four millimeters. It should be understood within the scope of the present invention that the diamond plate could be manufactured in alternate thicknesses. In step 105, the graphite is placed into a vacuum chamber and the vacuum chamber is filled with a mixture of the aforementioned gases. Step 107, the vacuum chamber is heated to a temperature between eight hundred to one thousand degrees Celsius.

In step 109, the materials in the vacuum chamber are exposed to an energy source wherein the energy source disassociates the gas molecules and forms a diamond layer on the graphite substrate. It is contemplated within the scope of the present energy that alternate energy sources could be employed or alternate substrate materials. By way of example, one preferred energy source is microwave plasma wherein the materials in the chamber are exposed thereto. Employing this technique, a plasma is created utilizing microwaves so as to break down the gas mixture containing carbon and hydrogen. The plasma provides sufficient energy to promote growth of diamond crystals on a substrate. Alternatively, it is contemplated within the scope of the present invention that the energy source could utilize an inductively-coupled plasma wherein this technique employs an inductively coupled plasma to generate a highly energetic plasma facilitating the growth of diamond crystals. Yet a further energy source that can be employed is a direct current plasma energy source. The direct current plasma technique is utilized to generate a plasma that breaks down the gas mixture containing carbon and hydrogen so as to promote growth of diamond crystals on a substrate. Lastly, it is contemplated within the scope of the present invention that a hot filament technique could be employed as the energy source. With this technique, a tungsten filament is heated to high temperatures which results in the creation of a plasma in the vacuum chamber that breaks down the gas mixture therein wherein the resulting carbon atoms deposit onto the substrate and growth of diamond crystals occurs thereon. It is further contemplated within the scope of the present invention that the alternate forms of chemical vapor deposition or plasma assisted techniques thereof could be employed in the present invention. By way of example but not limitation these could include thermal chemical vapor deposition, plasma enhanced chemical vapor deposition, hot-wire chemical vapor deposition and ultra-high vacuum chemical vapor deposition.

In step 111, the steps of 107 and 109 are repeated until a desired thickness of diamond plate has been achieved. Step 113, the high pressure high temperature process is commenced. In step 115, the diamond plate created though step 111 is placed in a high pressure chamber along with a small diamond seed. Step 117, the chamber is heated to a temperature range between one thousand five hundred and two thousand degrees Celsius. Additionally, during this step pressures of up to seventy thousand atmospheres are applied to the diamond plate disposed in the chamber. This step results in the carbon atoms in the diamond plate to rearrange and form a diamond crystal with the desired dimensions. In step 119, steps 103 through steps 117 are repeated in order to achieve a diamond crystal that is of the desired thickness and quality. While employment of both chemical vapor deposition process and high pressure high temperature process occurs in a preferred embodiment of the present invention, it should be understood within the scope of the present invention that employment of the high pressure high temperature process may not be necessary and is dependent upon the purity of the starting carbon source material. Furthermore, it should be understood within the scope of the present invention that the high pressure high temperature process could be utilized solely and independently of the chemical vapor deposition process. It should be understood that these steps could be repeated in alternate quantities. Step 121, the diamond plate produced by the method of the present invention is subjected to a final high pressure high temperature step as described here in step 117. This final high pressure high temperature high pressure treatment is operable to remove any defects and/or impurities so as to improve the quality of the final diamond crystal. In step 123, the diamond crystal is subjected to cutting and polishing wherein the diamond crystal is cut and polished to a desired dimension and shape.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical changes may be made without departing from the spirit or scope of the invention. The description may omit certain information known to those skilled in the art. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A method of manufacturing a diamond watch crystal wherein the method comprises the steps of:
selecting starting materials, wherein the starting materials are comprised of high purity gases to create a gas mixture and a high purity carbon source substrate;
initiating a chemical vapor deposition process, wherein the chemical vapor deposition process includes utilization of a vacuum chamber;
placing the substrate into the vacuum chamber;
filling the vacuum chamber with the high purity gases;
heating the vacuum chamber;
exposing the starting materials disposed within the vacuum chamber to an energy source;
growing a diamond plate on the substrate to a targeted thickness via repetition of the heating and exposing steps;
placing the diamond plate into a high pressure chamber, wherein the diamond plate is placed in the high pressure chamber with a diamond seed in order to execute a high pressure high temperature process;
heating the high pressure chamber, wherein the high pressure chamber is heated to approximately 1500 to 2000 degrees Celsius;
applying a pressure to the high pressure chamber, wherein the high pressure chamber has applied thereto a pressure up to 70,000 atmospheres;
repeating the chemical vapor deposition process and the high pressure high temperature process to finalize manufacture of a diamond plate; and
cutting and polishing the diamond plate, wherein the diamond plate is cut to a desired size and polished to form the diamond watch crystal.

2. The method of manufacturing a diamond watch crystal as recited in claim 1, wherein the energy source consists of microwaves to create a plasma in order to break down the gas mixture disposed in the vacuum chamber.

3. The method of manufacturing a diamond watch crystal as recited in claim 1, wherein the energy source consists of a direct current, wherein the direct current is utilized to generate a plasma that breaks down the gas mixture in the vacuum chamber.

4. The method of manufacturing a diamond watch crystal as recited in claim 1, wherein the energy source consists of an inductively coupled plasma, said inductively coupled plasma utilized to promote growth of diamond crystals.

5. The method of manufacturing a diamond watch crystal as recited in claim 1, wherein the energy source consists of a tungsten filament, wherein the tungsten filament is heated to a temperature to create a plasma operable to break down the gas mixture in the vacuum chamber.

6. The method of manufacturing a diamond watch crystal as recited in claim 2, wherein the gas mixture is comprised of hydrogen and methane.

7. The method of manufacturing a diamond watch crystal as recited in claim 6, wherein the vacuum chamber is heated to a temperature between 800 to 1,000 degrees Celsius.

8. The method of manufacturing a diamond watch crystal as recited in claim 7, and further including a step of executing a final high pressure high temperature process after the manufacture of the diamond plate, wherein the final high pressure high temperature process is operable to remove impurities from the diamond watch crystal.

9. A method of manufacturing a diamond watch crystal wherein the method comprises the steps of:
selecting starting materials, wherein the starting materials are comprised of high purity gases to create a gas mixture and a high purity carbon source substrate;
initiating a chemical vapor deposition process, wherein the chemical vapor deposition process includes utilization of a vacuum chamber;
placing the substrate into the vacuum chamber;
filling the vacuum chamber with the high purity gases;
heating the vacuum chamber;
exposing the starting materials disposed within the vacuum chamber to an energy source;
repeating the heating and exposing steps to grow a diamond plate on the substrate to a targeted thickness;
executing a final high pressure high temperature process on the diamond plate; and
cutting and polishing the diamond plate, wherein the diamond plate is cut to a desired size and polished to complete formation of the diamond watch crystal.

10. The method of manufacturing a diamond watch crystal as recited in claim 9, wherein the energy source consists of a direct current, wherein the direct current is utilized to generate a plasma that breaks down the gas mixture in the vacuum chamber.

11. The method of manufacturing a diamond watch crystal as recited in claim 9, wherein the energy source consists of an inductively coupled plasma, said inductively coupled plasma utilized to promote growth of diamond crystals.

12. The method of manufacturing a diamond watch crystal as recited in claim 9, wherein the energy source consists of a tungsten filament, wherein the tungsten filament is heated to a temperature to create a plasma operable to break down the gas mixture in the vacuum chamber.

13. The method of manufacturing a diamond watch crystal as recited in claim 9, wherein the energy source consists of microwaves to create a plasma in order to break down the gas mixture disposed in the vacuum chamber.

* * * * *